United States Patent [19]

Suzuki

[11] Patent Number: 5,164,245
[45] Date of Patent: Nov. 17, 1992

[54] METALLIZED MULTILAYER FILM

[75] Inventor: Kohji Suzuki, Yamagata, Japan

[73] Assignee: Minnesota Mining and Manufacturing Company, St. Paul, Minn.

[21] Appl. No.: 700,499

[22] Filed: May 15, 1991

[30] Foreign Application Priority Data

May 31, 1990 [JP] Japan .................. 2-143278

[51] Int. Cl.⁵ .................. B32B 5/00; B32B 7/12; B32B 15/08; B32B 27/08
[52] U.S. Cl. .................. 428/201; 428/40; 428/209; 428/212; 428/343; 428/347; 428/352; 428/421; 428/463
[58] Field of Search .............. 428/421, 463, 212, 461, 428/343, 352, 347, 201, 209; 156/229, 233

[56] References Cited

U.S. PATENT DOCUMENTS

| | | | |
|---|---|---|---|
| 3,915,779 | 10/1975 | Yoshikawa et al. | 156/229 |
| 4,068,034 | 1/1978 | Segawa et al. | 428/461 |
| 4,810,320 | 3/1989 | Inagaki | 156/233 |
| 5,030,394 | 7/1991 | Sietses et al. | 428/421 |

FOREIGN PATENT DOCUMENTS

| | | |
|---|---|---|
| 0133821 | 3/1985 | European Pat. Off. . |
| 0154339 | 9/1985 | European Pat. Off. . |
| 47-22973 | 10/1972 | Japan . |
| 60-71249 | 4/1985 | Japan . |
| 63-87027 | 6/1988 | Japan . |

OTHER PUBLICATIONS

DX-Film General Properties Aug. 1, 1988.
Denka DX-Film Dec. 1988.

Primary Examiner—Thomas J. Herbert, Jr.
Attorney, Agent, or Firm—Gary L. Griswold; Walter N. Kirn; Steven E. Skolnick

[57] ABSTRACT

A metallized multilayer film comprising a first substrate layer, a second substrate layer, and a layer of metal. The first substrate layer comprises from 0 to about 40 parts by weight poly(vinylidine fluoride) and, correspondingly, from 100 to about 60 parts by weight poly(methyl methacrylate). The second substrate layer comprises from about 70 to 100 parts by weight poly(vinylidine fluoride) and, correspondingly, from about 30 to 0 parts by weight poly(methyl methacrylate).

9 Claims, 1 Drawing Sheet

METALLIZED MULTILAYER FILM

BACKGROUND OF THE INVENTION

1. Field of the Invention

This invention relates to metallized multilayer films and, more particularly, to metallized films having a substrate which includes poly(vinylidine fluoride) and poly(methyl methacrylate).

2. Description of the Related Art

Metallized films, that is, films comprising a polymeric substrate on which has been deposited a layer of metal, are often employed in, for example, the automotive, furniture, stationery, interior building material, and advertising industries so as to provide an aesthetic or decorative enhancement to manufactured articles. Such films, in order to be commercially useful as decorative and aesthetic enhancements, should possess several characteristics.

For example, the substrate layer should be highly transparent so as not to detract from the reflective quality of the metal layer and the overall appearance of the article. The films should also exhibit good heat stability, especially when employed in the construction of outdoor signs, motor vehicles and other articles where high temperatures may be encountered. For example, the interior of a motor vehicle on a warm, sunny day in certain climates may experience temperatures in excess of 90° C.

Flexibility is another desirable quality because flexible films are more readily applied to rough or uneven surfaces and multifaceted articles having a compound geometry. In still other applications, metallized multilayer films may be embellished with printed messages, decorative patterns, or complementary decorative transparent, colored layers. Metallized films, in order to be commercially useful, should readily accept printing and should be susceptible to the adhesion of further decorative layers thereto. Such films should also possess excellent adhesion between the metal and substrate layers. The films should be capable of being applied in an economical manner and retain a quality appearance without developing bubbles, wrinkles, swells or the like. Once applied, the films should remain durable and exhibit good resistance to a wide variety of weathering and environmental conditions.

Those metallized films which are presently known exhibit some, but not all, of these desirable features. Thus, while being useful in particular applications, the presently known films may not be broadly employed in a diverse myriad of circumstances. For example, metallized polyester films (as described in the *Plastic Handbook* published by Asakura Shoten), while being transparent and heat stable, have poor flexibility and exhibit, at best, only fair post-application durability. Various metallized polyester films are commercially available and have been for many years. Metallized acrylic films described in *Plastic Material Course*, Volume 12, Acrylic Resin, published by Nikkan Kogyo Shimbunsha, while being transparent and having good adhesion between the metal layer and the acrylic resin substrate, do not exhibit good heat stability or flexibility.

Metallized films comprising a metal layer deposited on a single layer fluoropolymer substrate have fair heat stability and durability, as well as good adhesion between the metal layer and the fluoropolymer substrate. However, these films are not readily printable. Films of this type are illustrated in Japanese Patent Kokai No. 22973/72, Japanese Patent Kokai No. 71249/85, and Japanese Utility Model Kokai No. 87027/88.

The performance characteristics of the presently known metallized films are summarized in Table I below.

TABLE I

| METALLIZED FILM SUBSTRATE | PERFORMANCE CHARACTERISTIC | | | | | |
|---|---|---|---|---|---|---|
| | Transparency | Heat Stability | Flexibility | Printability | Metal Layer Adhesion | Durability After Application |
| Polyester | ○ | ○ | X | Δ | ○ | Δ-X |
| Acrylic | ○ | X | X | Δ | ○ | Δ-X |
| Fluoropolymer (single layer) | Δ-X | ○-Δ | Δ | X | ○ | Δ |

○: Good
Δ: Fair
X: Poor

A double layer film believed to include a first layer having 80% poly(vinylidine fluoride) and 20% poly(methyl methacrylate) and a second layer having 20% poly(vinylidine fluoride) and 80% poly(methyl methacrylate) is commercially available in Japan from Denki Kagaku Kogyo K.K. as DENKA DX-Film. The film is stated to exhibit excellent weatherability and may be used as a protective cover for metal and plastic boards, as a protective cover for tent clothes, and as a protective or a decorative cover for various substrates. The DENKA DX-Film does not include a metal layer.

Accordingly, there remains a need for a metallized film which is transparent, heat stable, flexible, readily printable, durable after being applied, and wherein the metal layer has good adhesion to the film substrate.

SUMMARY OF THE INVENTION

This invention relates to a metallized multilayer film comprising a first substrate layer, a second substrate layer on the first substrate layer, and a layer of metal on the second substrate layer. The first substrate layer comprises from 0 to about 40 parts by weight poly(vinylidine fluoride) and, correspondingly, from 100 to about 60 parts by weight poly(methyl methacrylate). The second substrate layer comprises from about 70 to 100 parts by weight poly(vinylidine fluoride) and, correspondingly, from about 30 to 0 parts by weight poly(methyl methacrylate). The metal layer may be formed of chromium, nickel, aluminum, stainless steel, tin and alloys thereof and may be in the form of an interrupted pattern on the second substrate layer.

The metallized multilayer film may further comprise a layer of an adhesive on the metal layer and a release liner on the adhesive layer. The first substrate layer may further include a printing ink deposited thereon or a layer of a colored resinous material.

Metallized multilayer films according to the invention may be applied to the surface of an article so as to provide a decorative and aesthetic enhancement therefor. Metallized multilayer films according to the invention are flexible, durable, heat stable, readily printable, and exhibit good resistance to outdoor weathering.

BRIEF DESCRIPTION OF THE DRAWINGS

The invention will be more fully understood with reference to the following drawings wherein similar reference numerals identify analogous components throughout and in which.

DETAILED DESCRIPTION OF THE PREFERRED EMBODIMENTS

Figure 1:
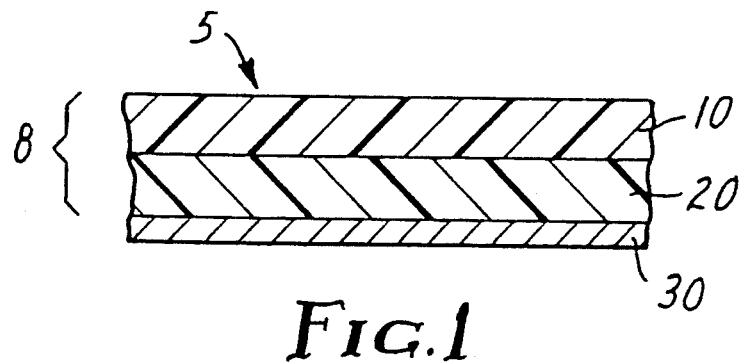
FIG. 1 is an enlarged cross-sectional view of a metallized multilayer film according to the invention.

Turning now to the drawings, FIG. 1 is an enlarged cross-sectional view of a metallized multilayer film 5 according to the invention. The film 5 comprises a multilayer composite substrate 8 (which, in turn, comprises a first substrate layer 10 and a second substrate layer 20 on the first substrate layer) and a metal layer 30 on the composite substrate 8.

The first substrate layer 10 comprises either poly(methyl methacrylate) (PMMA) or a blend of poly(vinylidine fluoride)(PVDF) and PMMA. The PVDF and the PMMA comprising the first substrate layer 10 are preferably combined in a ratio of from 0 to about 40 parts by weight PVDF and, correspondingly, from 100 to about 60 parts by weight PMMA. The second substrate layer 20 comprises either PVDF or a blend of PVDF and PMMA. In the second substrate layer 20, the PVDF and PMMA are preferably combined in a ratio of from about 70 parts to 100 parts by weight PVDF and, correspondingly, from about 30 parts to 0 parts by weight PMMA.

As used herein, poly(vinylidine fluoride) includes both homopolymers of vinylidine fluoride and copolymers comprising vinylidine fluoride and another monomer copolymerizable therewith. Examples of suitable comonomers include, for example, vinyl fluoride, tetrafluoroethylene, and chlorotrifluoroethylene. Similarly, poly(methyl methacrylate), as used herein, includes both methyl methacrylate homopolymers and copolymers comprising methyl methacrylate and another monomer copolymerizable therewith. Suitable comonomers, include, for example, butyl methacrylate and ethyl methacrylate. Furthermore, the first and second substrate layers 10 and 20, respectively, may include various antioxidants, UV stabilizers, and the like so long as they are added in an amount that does not materially adversely affect the ultimate performance of the metallized multilayer film 5.

A substrate based on PVDF, PMMA and blends thereof exhibits superior transparency as compared to substrates based exclusively on PVDF, polytetrafluoroethylene or polyvinyl chloride. The transparency of these various substrates was qualitatively compared by vapor coating a layer of alumium thereon with the results shown in Table II below. The PVDF and PMMA in the composite film structure were blended in an arbitrary ratio. The thickness of each sample film was about 50 microns. Table II indicates that film substrates based on PVDF and PMMA exhibit superior transparency over other substrates.

TABLE II

| Metallized Film Substrate Material | Transparency |
|---|---|
| PVDF | ○-△ |
| PVDF/PMMA | ○ |
| Polytetrafluoroethylene | X |
| Polyvinyl chloride | X |

○: High
△: Medium
X: Low

The first and second substrate layers 10 and 20, respectively, are combined so as to form the composite substrate layer 8 using conventional techniques such as, for example, coextrusion at a temperature of about 200°-300° C. or roll pressing at a temperature of about 170°-250° C. and a pressure of about 5-20 kilograms/square centimeter. Once the composite substrate layer 8 comprising the first and second substrate layers 10 and 20 has been formed, the metal layer 30 may be deposited thereon using well known techniques such as, for example, vacuum vapor deposition, sputtering, ion plating or the like. The metal layer 30 may be formed of materials such as chromium, nickel, aluminum, stainless steel, tin and alloys thereof. Preferably, the metal layer 30 is deposited on the substrate layer having the predominant amount of PVDF, i.e., the second substrate layer 20 herein.

Figure 2:
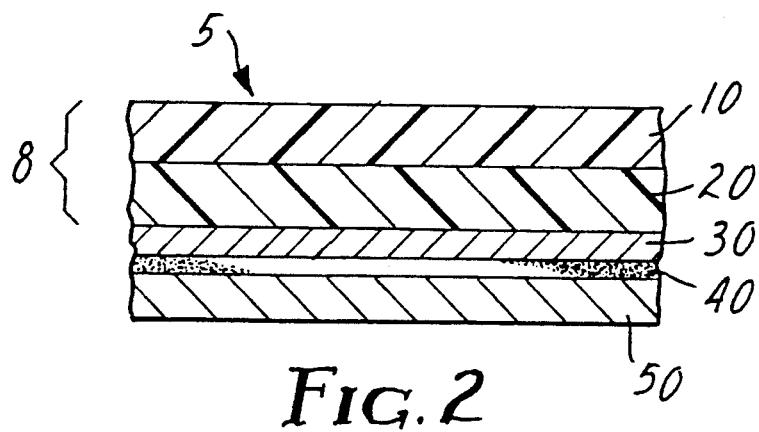
FIG. 2 is an enlarged cross-sectional view of a second embodiment of a metallized multilayer film according to the invention.

Referring now to FIG. 2, an enlarged cross-sectional view of a second embodiment of a metallized multilayer film 5 according to the invention, the film comprises a composite substrate 8 (which, in turn, comprises first and second substrate layers 10 and 20), and a metal layer 30, all as described more fully hereinabove. The film 5 further comprises an adhesive layer 40 and a release liner 50. Adhesive layer 40 may comprise any of a wide variety of conventionally known adhesive materials including, for example, acrylic, rubber, silicone resin and heat curable epoxy adhesives. Preferably, the adhesive layer 40 is applied to the surface of the metal layer 30 opposite the surface which engages the second substrate layer 20. Release liner 50 is applied to the exposed surface of the adhesive layer 40 and protects the adhesive layer until the film 5 is ready for use.

In application, release liner 50 is removed thereby exposing adhesive layer 40. The film 5 is then placed on the surface (not shown separately in the drawings) to which the film is to be applied and pressure is applied to the film for a time sufficient to strongly adhere the same to the surface.

Figure 3:
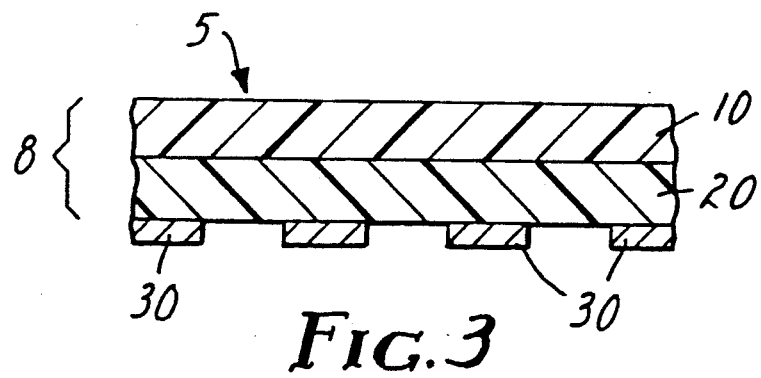
FIG. 3 is an enlarged cross-sectional view of a third embodiment of a metallized multilayer film according to the invention.

A third embodiment of a metallized multilayer film 5 according to the invention is illustrated in the enlarged cross-sectional view of FIG. 3. The metallized multilayer film 5 is similar to that shown in FIG. 1 and comprises a composite substrate layer 8 (which, in turn, comprises first and second substrate layers 10 and 20 respectively), and a layer of metal 30, which metal layer has been applied to the second substrate layer in an interrupted arrangement so as to provide a decorative pattern. Though not shown separately in FIG. 3, the film 5 thereof may also include an adhesive layer and a release liner as described in conjunction with FIG. 2.

In each of the embodiments of FIGS. 1 to 3, the first substrate layer 10 may further include a printing ink or a layer of a colored resinous material deposited thereon. Suitable printing inks include, for example, acrylic and polyvinyl chloride/acetate copolymer inks. Suitable resinous materials include, as examples, laminates which incorporate polyvinyl chloride or an acrylate resin.

The following examples are offered to further illustrate the invention and are not to be construed as limiting the scope thereof. In the examples, all parts refer to parts by weight unless indicated otherwise.

EXAMPLES 1–8

A series of metallized films comprising a layer of aluminum deposited on different substrates was prepared. The substrates comprised a single PVDF/PMMA layer, the examples varying in the relative proportions of PVDF and PMMA. The samples were then evaluated for their heat stability and their ability to adhere a printing ink.

More particularly, approximately 10 cm × 10 cm sections of the sample materials were placed in an oven and maintained at an elevated temperature of either 70° C., 100° C. or 120° C. for one week. After the expiration of one week, the samples were qualitatively evaluated for the quality of the mirror-like appearance which the metal layer exhibited. The results are shown below in Table III.

Ability to adhere a printing ink was determined by applying an acrylic ink (SCOTCHCAL 3903 brand screen ink, commercially available from the Minnesota Mining and Manufacturing Co., St. Paul, Minn.) and a polyvinyl chloride/acetate copolymer ink (SCOTCHCAL 3920 brand screen ink, commercially available from the Minnesota Mining and Manufacturing Co., St. Paul, Minn.) and evaluating for peel adhesion. The inks were screen printed onto the substrate materials through a 270 mesh screen, dried at 65° C. for two hours, and then allowed to cool at room temperature for about one hour. The ink layer was then cut through (without harming the underlying substrate) to form a grid or lattice pattern. A strip of SCOTCH 610 brand cellophane tape (commercially available from the Minnesota Mining and Manufacturing Co., St. Paul, Minn.) was applied over the ink layer and firmly pressed thereto. The tape was then peeled from the film in a single continuous motion. If the ink remained on the substrate in good condition, the substrate was considered as having good adhesion to the printing ink. The results are shown below in Table III.

by weight PVDF and, correspondingly, from about 30 parts to 0 parts by weight PMMA exhibit good heat stability, even at temperatures of about 120° C. On the other hand, substrates comprising PVDF and PMMA in a ratio of 0 parts to about 40 parts PVDF and, correspondingly, from 100 parts to about 60 parts by weight PMMA exhibit good adhesion to acrylic and polyvinyl chloride/acetate copolymer printing inks.

The substrate layer in which the PVDF predominates contributes to the heat stability of the overall article. On the other hand, the substrate layer in which the PMMA predominates demonstrates good adhesion to printing inks. By combining first and second substrate layers having the PVDF and PMMA ratios described hereinabove, the advantageous qualities of each layer may be realized. Preferably, the outermost substrate layer (i.e. the first substrate layer 10 herein) comprises PVDF and PMMA in a ratio of about 0 parts to about 40 parts PVDF and, correspondingly, from 100 parts to about 60 parts PMMA. The innermost substrate layer (i.e. the second substrate layer 20 on which the metal layer may be deposited) preferably comprises PVDF and PMMA in a ratio of from about 70 parts to 100 parts PVDF and, correspondingly, from about 30 parts to 0 parts PMMA.

Reasonable variations or modifications of the forgoing specification and drawings are possible without departing from the scope of the invention which is defined in the accompanying claims.

The embodiments for which an exclusive property or privilege is claimed are defined as follows:

1. A metallized multilayer film comprising a composite substrate and a layer of metal on said composite substrate, said composite substrate comprising a first substrate layer and a second substrate layer on said first substrate layer, wherein said first substrate layer comprises from 0 to about 40 parts by weight poly(vinylidine fluoride) and, correspondingly, from 100 to about 60 parts by weight poly(methyl methacrylate), and further wherein said second substrate layer comprises from about 70 to 100 parts by weight poly(vinylidine fluoride) and, correspondingly, from about 30 to 0 parts by weight poly(methyl methacrylate).

2. A metallized multilayer film according to claim 1 further comprising a printing ink deposited on said first substrate layer.

TABLE III

| | Example No. | | | | | | | |
|---|---|---|---|---|---|---|---|---|
| | 1 | 2 | 3 | 4 | 5 | 6 | 7 | 8 |
| Parts by weight ratio of PVDF:PMMA | 0:100 | 20:80 | 40:60 | 50:50 | 60:40 | 70:30 | 80:20 | 100:0 |
| Heat Stability: | | | | | | | | |
| at 70° C. | X | X | X | Δ | O | O | O | O |
| at 100° C. | X | X | X | X | Δ | O | O | O |
| at 120° C. | X | X | X | X | Δ | O | O | O |
| Adhesion to Printing Ink: | | | | | | | | |
| Acrylic ink | O | O | O | Δ | X | X | X | X |
| Polyvinyl chloride/acetate copolymer ink | O | O | O | Δ | Δ | X | X | X |

Heat Stability:
O: Good
Δ: Decrease of mirror like appearance
X: Dissolution of mirror like appearance
Adhesion to Printing Ink:
O: Good
Δ: Fair
X: Poor Table III shows that substrates comprising PVDF and PMMA in the range of about 70 parts to 100 parts 3. A metallized multilayer film according to claim 1 further comprising a layer of a colored resinous material on said first substrate layer.

4. A metallized multilayer film according to claim 1 wherein said layer of metal is on said second substrate layer.

5. A metallized multilayer film according to claim 4 wherein said metal is selected from the group consisting of chromium, nickel, aluminum, stainless steel, tin and alloys thereof.

6. A metallized multilayer film according to claim 4 wherein said layer of metal forms an interrupted pattern on said second substrate layer.

7. A metallized multilayer film according to claim 5 further comprising a layer of an adhesive on said layer of metal.

8. A metallized multilayer film according to claim 7 further comprising a release liner on said layer of adhesive.

9. An article, said article having a surface which bears a metallized multilayer film according to claim 7 thereon.

* * * * *